United States Patent
Lee et al.

(10) Patent No.: US 7,193,470 B2
(45) Date of Patent: Mar. 20, 2007

(54) METHOD AND APPARATUS FOR CONTROLLING A POWER AMPLIFIER IN A MOBILE COMMUNICATION SYSTEM

(75) Inventors: Dong-Geun Lee, Seoul (KR); Hyun-Su Yoon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 10/792,378

(22) Filed: Mar. 4, 2004

(65) Prior Publication Data
US 2004/0222853 A1    Nov. 11, 2004

(30) Foreign Application Priority Data
Mar. 4, 2003  (KR) ................ 10-2003-0013219
May 27, 2003  (KR) ................ 10-2003-0033841

(51) Int. Cl.
*H03G 3/30*    (2006.01)
(52) U.S. Cl. .............. 330/285; 330/136; 330/289; 330/297
(58) Field of Classification Search .......... None
See application file for complete search history.

(56) References Cited

U.S. PATENT DOCUMENTS

| | | | |
|---|---|---|---|
| 5,251,330 A * | 10/1993 | Chiba et al. ............. | 455/127.3 |
| 6,492,867 B2 * | 12/2002 | Bar-David ................. | 330/136 |
| 6,639,471 B2 * | 10/2003 | Matsuura et al. .......... | 330/285 |
| 6,741,127 B2 * | 5/2004 | Sasho et al. ............... | 330/136 |

* cited by examiner

*Primary Examiner*—Khanh Van Nguyen
(74) *Attorney, Agent, or Firm*—Roylance, Abrams, Berdo & Goodman, L.L.P.

(57) ABSTRACT

A power amplification controlling apparatus and method in a mobile communication system are provided. An amplifying part amplifies an input Radio Frequency (RF) signal with a power supply voltage. A bias adaptation part detects at least one of environmental changes of the amplifying part, attenuates the RF signal according to the detected environmental change, detecting the envelope of the attenuated signal, and generates a supply voltage control signal according to the envelope. A power supply part changes the power supply voltage in response to the supply voltage control signal.

9 Claims, 11 Drawing Sheets

US 7,193,470 B2

METHOD AND APPARATUS FOR CONTROLLING A POWER AMPLIFIER IN A MOBILE COMMUNICATION SYSTEM

This application claims priority under 35 U.S.C. § 119 to an application entitled "Method and Apparatus for Controlling Power Amplifier in a Mobile Communication System" filed in the Korean Intellectual Property Office on Mar. 4, 2003 and assigned Serial No. 2003-13219 and to an application entitled "Method and Apparatus for Controlling Power Amplifier in a Mobile Communication System" filed in the Korean Intellectual Property Office on May 27, 2003 and assigned Serial No. 2003-33841, the contents of both of which are incorporated herein by reference.

BACKGROUND OF THE INVENTION

1. Field of the Invention

The present invention relates generally to a mobile communication system, and in particular, to a method and apparatus for controlling a power amplifier.

2. Description of the Related Art

In a communication system such as a bandwidth-efficient digital system using Quadrature Amplitude Modulation (QAM) or a Frequency Demodulation Multiplexing (FDM) communication system using multi-carrier or single sideband (SSB) signals, a signal is subject to modulation and multiplexing and thus the time-varying envelope of its Peak to Average power Ratio (PAR) varies greatly. A base station (BS) uses a power amplifier (PA) with good linearity to amplify a Radio Frequency (RF) signal prior to transmission in the communication system.

A cellular system such as Code Division Multiple Access (CDMA) or Orthogonal Frequency Division Multiplexing (OFDM) transmits a modulated multiplexed signal having a high PAR to multiple users sharing the same frequency band. Radio Frequency Power Amplifiers (RFPA) used in conventional communication systems use power inefficiently because they consume a large amount of Direct Current (DC) to amplify the RF signal having a high PAR and are expensive to manufacture. [No need.]

In order to increase the efficiency of a PA, the power drawn from a power supply for the PA is adjusted according to the size of a signal envelope. This principle is called bias adaptation. This bias control scheme controls DC bias according to the envelope of an input signal into a transistor in order to reduce power consumption in the transistor.

FIG. 1 is a block diagram illustrating an example of a conventional power amplification control apparatus using a general bias control scheme.

Referring to FIG. 1, the power amplification controlling apparatus comprises an envelope detecting circuit (EDC) 101 for detecting the envelope of an input signal and a voltage upconverter (VUC) 102 for upconverting a DC voltage $V_c$ received from a DC supply 103 which is a system voltage supply based on the signal envelope.

When the voltage of the input signal (RF In) envelope exceeds a predetermined threshold, the VUC 102 increases the power supply voltage. Therefore, the change of mean input power varies the characteristics of an RFPA 104. Also, the characteristics of the RFPA 104 and the EDC 101 vary with temperature changes. As a result, the RFPA 104 cannot perform optimum amplification.

Unlike a PA in a terminal, a PA in a BS consumes hundreds of watts and thus requires a VUC of hundreds of watts. However, the manufacture of such a VUC is not viable because of manufacturing costs and technological constraints. As a solution to this problem, the power amplification control apparatus illustrated in FIG. 2 was proposed.

FIG. 2 is a block diagram illustrating an example of a conventional power amplification controlling apparatus using an improved bias control scheme. The improved bias control scheme uses two DC voltages instead of one DC voltage.

Referring to FIG. 2, the power amplification controlling apparatus comprises a first DC supply 203 for supplying a power supply voltage $V_c$, a voltage combiner (VC) 205 for combining $V_c$ with a voltage $V_v$ received from a voltage up converter (VUC) 202, and a second DC supply 206 for supplying a voltage Max $V_v$ to the VUC 202. The VUC 202 and the VC 205 collectively form a voltage enhancement circuit (VEC) 207.

The first DC supply 203 supplies a predetermined constant DC voltage $V_c$ to an RFPA 204 through the VC 202. The VUC 202 changes the voltage max $V_v$ to the voltage $V_v$ between 0 and Max $V_v$ according to the envelope of a signal input to the RFPA 204. The second DC supply 206 outputs Max $V_v$ which is a maximum value of the output voltage $V_v$ of the VUC 202.

In operation, if the voltage of the input signal envelope is equal to or less than a predetermined threshold, $V_c$ is supplied to the RFPA 204. If the signal envelope voltage exceeds the threshold, the VUC 202 adds $V_v$ to $V_c$ As a result, the sum as a bias voltage $V_p$ ($V_p=V_c+V_v$) supplies to the RFPA 204. For supplying $V_c$, an existing power supply of hundreds of watts is used. However, the VUC 202 for supplying the voltage $V_v$ varying with the input signal envelope can be implemented at tens of watts.

The relationship among the power supply voltage $V_c$, the break-down voltage $V_b$ of a transistor, the VUC output voltage $V_v$, and the bias voltage $V_p$ over the signal envelope is illustrated in FIG. 3.

In the power amplification controlling apparatus illustrated in FIG. 2, Max $V_v$ must be ($V_b-V_c$) to protect the transistor. In other words, Max $V_v$ must be determined according to $V_b$. However, $V_c$ varies due to the use of an auxiliary power supply in the case of an electrical failure in a BS, or due to power discharge in a terminal. Therefore, with Max $V_v$ fixed to ($V_b-V_c$), if $V_c$ rises by $\Delta V_c$, $V_p=V_c+\Delta V_c+V_v>V_b$, it leads to deterioration of the transistor characteristics or the destruction of the transistor. If $V_c$ drops by $\Delta V_c$, $V_p=V_c-\Delta V_c+V_v<V_b$, the resulting distortion of the input signal to the RFPA 204 leads to deterioration of the spurious characteristics of the input signal.

SUMMARY OF THE INVENTION

An object of the present invention is to substantially solve at least the above problems and/or disadvantages and to provide at least the advantages below. Accordingly, an object of the present invention is to provide an apparatus and method for improving the efficiency of a power amplifier in a bias adaptation scheme based on envelope shaping changes in order to transmit a signal having a very high Peak to Average power Ratio (PAR).

Another object of the present invention is to provide an apparatus and method for improving the efficiency of a power amplifier by optimizing a power supply voltage for application to the power amplifier through a bias adaptation part that controls the attenuation of an input Radio Frequency (RF) signal and generates a power supply voltage control signal.

A further object of the present invention is to provide an apparatus and method for improving the efficiency of a power amplifier by optimizing its performance adaptively according to changes in the amplification environment of a high-PAR signal, such as changes in mean input power, a power supply voltage, and an operation temperature.

Still another object of the present invention is to provide an apparatus and method for maintaining the characteristics of a power amplifier against changes in power supply voltage.

Yet another object of the present invention is to provide a power amplification controlling apparatus and method for protecting a transistor against changes in power supply voltage.

The above objects are achieved by providing a power amplification controlling apparatus and method in a mobile communication system.

According to one aspect of the present invention, in a power amplification controlling apparatus, an amplifying part amplifies an input RF signal with a power supply voltage. A bias adaptation part detects at least one of environmental changes of the amplifying part, attenuates the RF signal according to the detected environmental change, detects the envelope of the attenuated signal, and generates a supply voltage control signal according to the envelope. A power supply part changes the power supply voltage in response to the supply voltage control signal.

According to another aspect of the present invention, in a power amplification controlling method, at least one of amplifier's environmental change is detected, the envelope of an input signal is detected, and a supply voltage control signal is generated according to the signal envelope and the at least one of the environmental changes of the amplifier. The power supply voltage is changed in response to the supply voltage control signal and applies a bias voltage for amplification.

According to a further aspect of the present invention, in a power amplification controlling apparatus, an input part generates an RF signal by modulating an input baseband signal and detecting the envelope of the baseband signal. An amplifying part amplifies the RF signal with a power supply voltage. A bias adaptation part detects at least one of environmental changes of the amplifying part and generates a supply voltage control signal according to the signal envelope. A power supply part controls the power supply voltage in response to the supply voltage control signal received from the bias adaptation part.

According to still another aspect of the present invention, in a power amplification controlling method, an RF signal is generated by modulating an input baseband signal, the envelope of the baseband signal is detected, at least one of environmental changes of an amplifier is detected, and a supply voltage control signal is generated according to the signal envelope and at least one of environmental changes. The power supply voltage is controlled in response to the supply voltage control signal.

According to yet another aspect of the present invention, in a power amplification controlling apparatus, a voltage converter outputs a variable Direct Current (DC) voltage according to the envelope of an input RF signal, a supply voltage variation compensator controls a maximum output voltage from the voltage converter according to a change in a power supply voltage output from a power supply, and a voltage combiner provides the sum of the output voltage of the voltage converter and the power supply voltage of the power supply as a bias voltage to a power amplifier.

According to further another aspect of the present invention, in a method of controlling a bias voltage for amplification in a power amplifying apparatus for amplifying an input RF signal, a variation is detected in a predetermined power supply voltage. Upon detection of the power supply voltage variation, a voltage variable with an envelope voltage of an input signal is controlled according to the power supply voltage variation. The sum of the controlled voltage and the predetermined power supply voltage is provided as the bias voltage.

BRIEF DESCRIPTION OF THE DRAWINGS

The above and other objects, features and advantages of the present invention will become more apparent from the following detailed description when taken in conjunction with the accompanying drawings in which:

FIGS. 11A and 1B are graphs illustrating an example of a comparison in voltage relationship between a conventional power amplification control apparatus and the apparatus illustrated in FIG. 8 when the power supply voltage drops.

DETAILED DESCRIPTION OF THE PREFERRED EMBODIMENTS

Embodiments of the present invention will be described herein below with reference to the accompanying drawings. In the following description, well-known functions or constructions are omitted for conciseness.

The embodiments of the present invention provide a power amplification control apparatus and method in a mobile communication system. It proposes a method of generating a power supply voltage control signal according to environmental changes of an amplifier and a method of controlling a bias voltage for a PA according to the change in a power supply voltage.

A description will first be made of a power amplification control apparatus according to an embodiment of the present invention with reference to FIG. 4.

Figure 1:
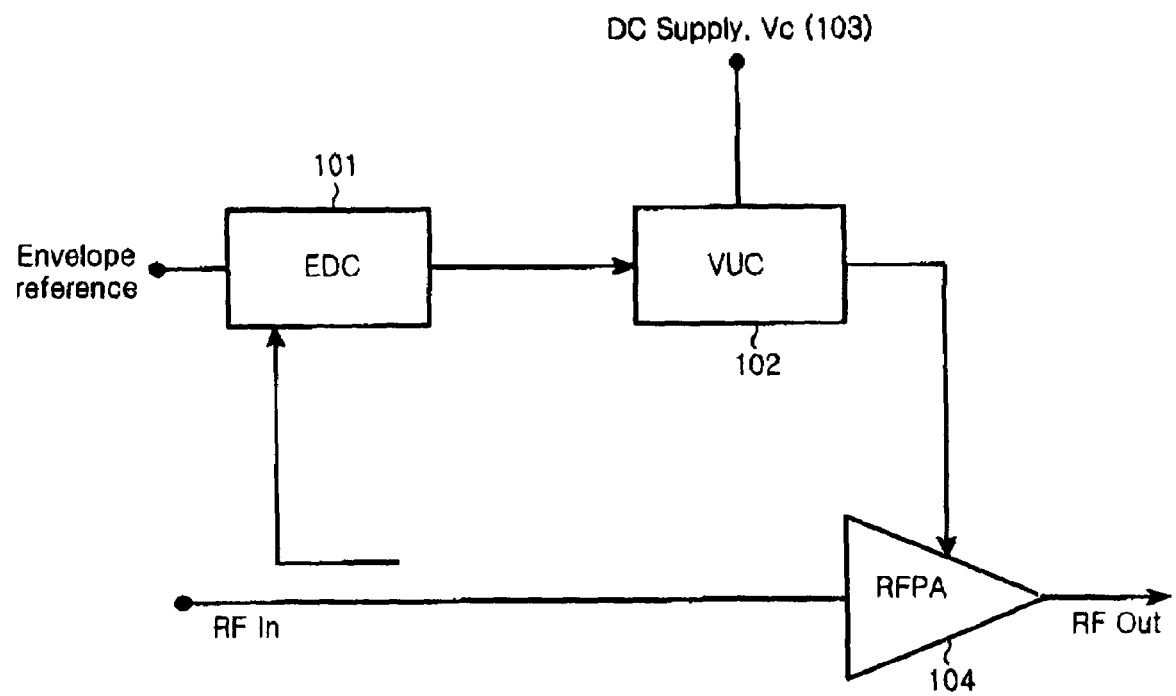
FIG. 1 is a block diagram illustrating an example of a conventional power amplification control apparatus using a general bias control scheme.
Figure 2:
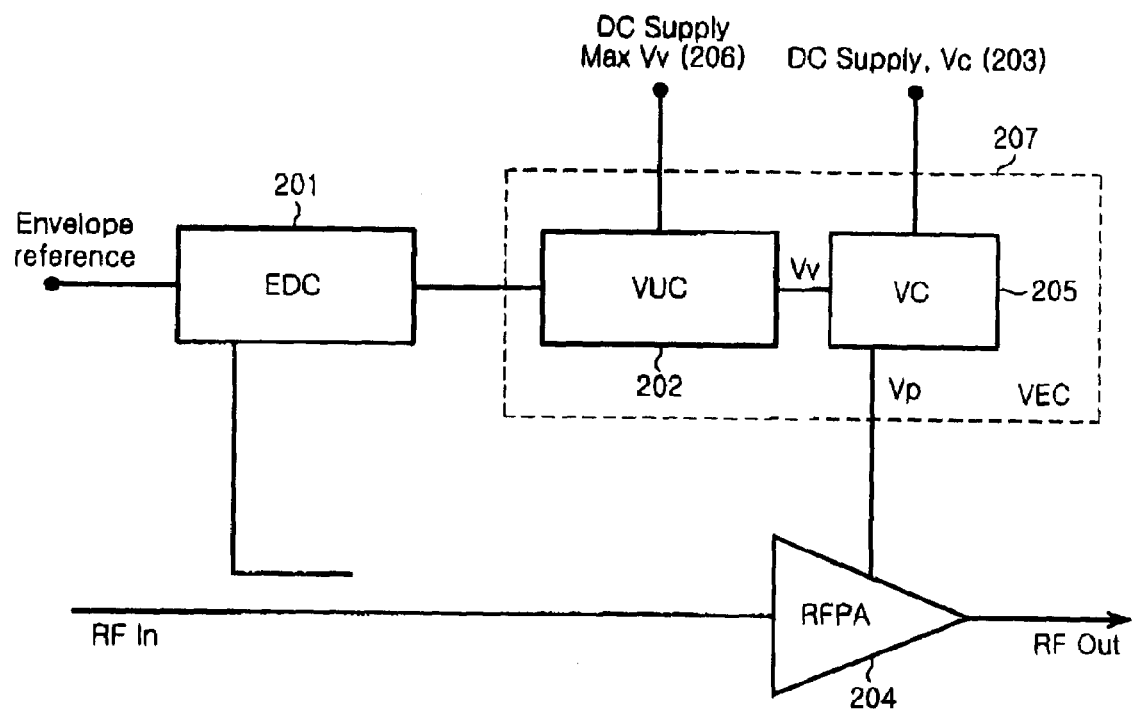
FIG. 2 is a block diagram illustrating an example of a conventional power amplification control apparatus using an improved bias control scheme.
Figure 3:
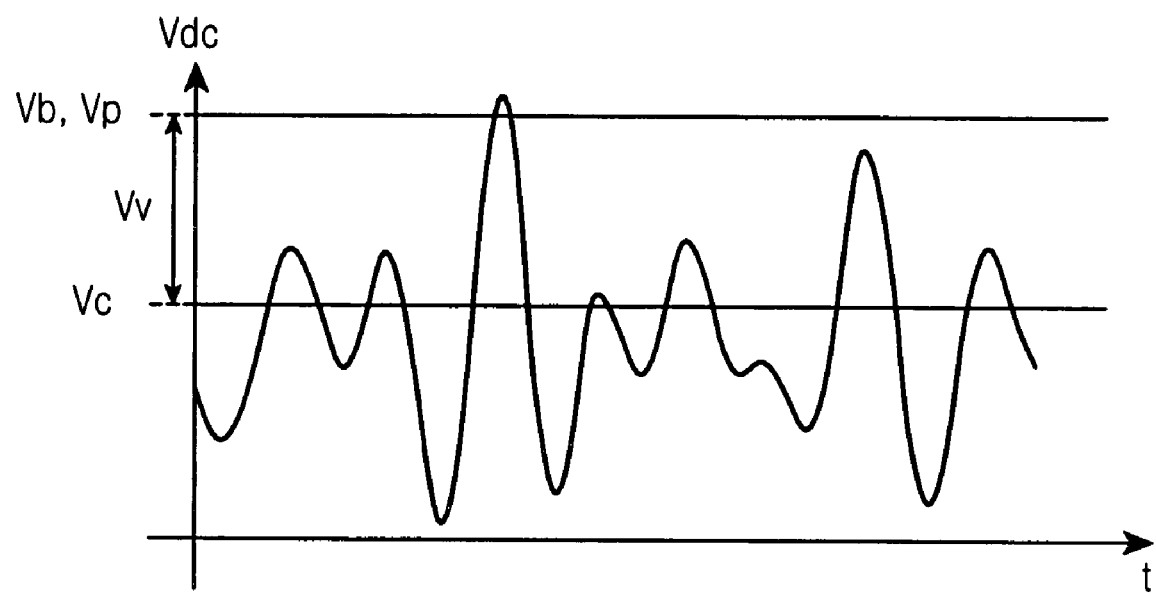
FIG. 3 is a graph illustrating an example of a voltage relationship in the power amplification control apparatus illustrated in FIG. 2.
Figure 4:
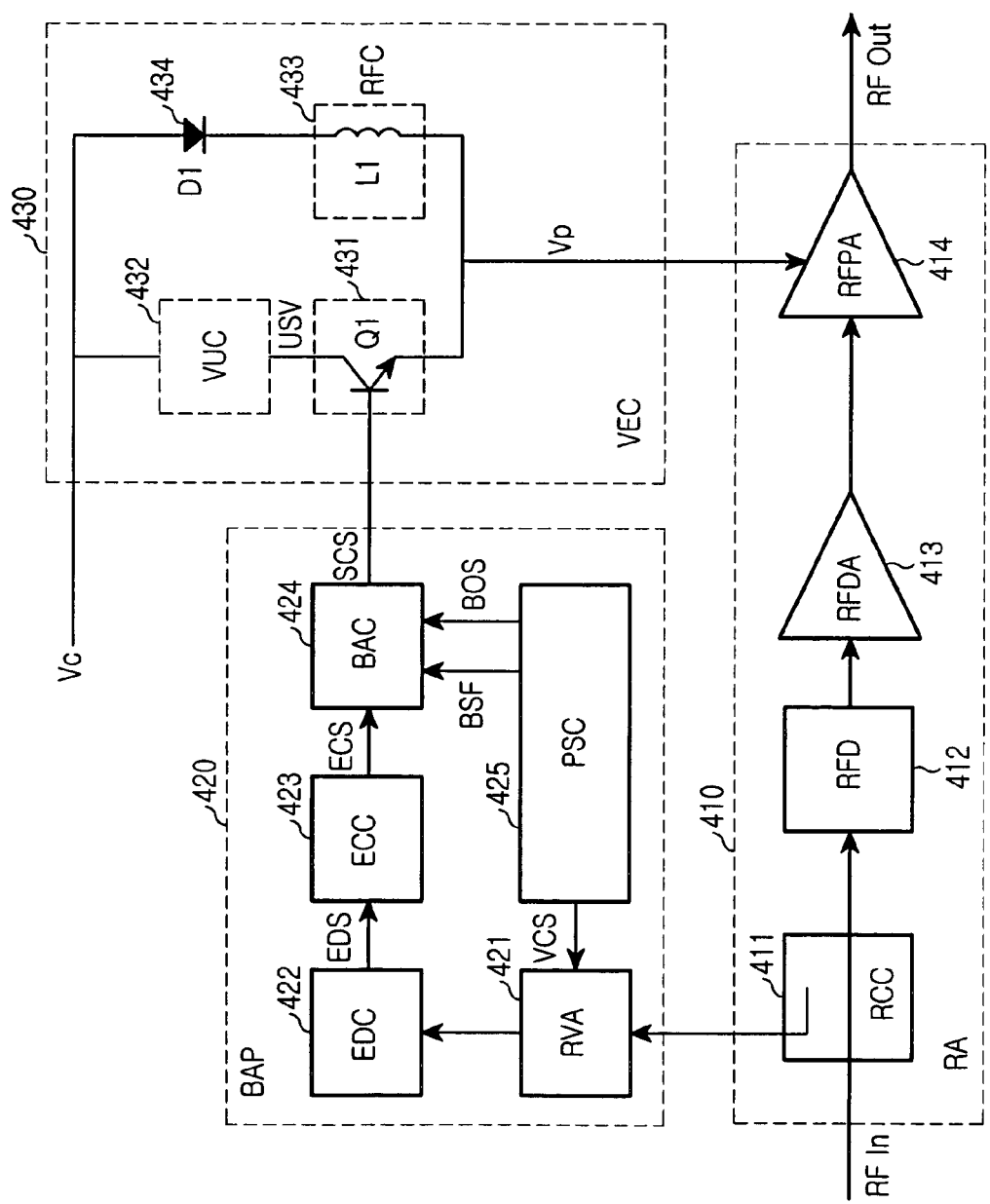
FIG. 4 is a block diagram illustrating an example of a power amplification control apparatus based on a bias control scheme according to an embodiment of the present invention.

FIG. 4 is a block diagram illustrating an example of the structure of a power amplification control apparatus according to an embodiment of the present invention.

Referring to FIG. 4, the power amplification control apparatus comprises an RF signal amplifying part (RAP) 410 for amplifying an input RF signal (RF in), a bias adaptation part (BAP) 420 for detecting the envelope of the RF signal and controlling a power supply voltage $V_p$ applied to the RAP 410, and a VEC 430 for providing the controlled $V_p$ to the RAP 410.

The RAP 410 includes an RF coupling circuit (RCC) 411 connected between the BAP 420 and an RF delay (RFD) 412, for feeding the input RF signal to both the BAP 420 and the RFD 412. The RFD 412 matches the timing of signal output from the VEC 430 to an RFPA 414 to the signal output from an RF Drive Amplifier (RFDA) 413 to the RFPA 414. The RFDA 413 and the RFPA 414 amplify the RF signal. The RFDA 413 functions to control the level of an input signal to the RFPA 414.

The BAP 420 includes an RF variable attenuator (RVA) 421 for receiving the RF signal from the RCC 411, an EDC 422 for detecting the envelope of the RF signal, an envelope compensation circuit (ECC) 423, a bias adaptation circuit (BAC) 424, and a PA supply voltage controller (PSC) 425.

The PSC 425 controls the RVA 421 and the BAC 424 to adjust a PA supply voltage for the RFPA 414.

When the operation or environment of the RFPA 414 changes with the mean input power, a power supply voltage, and an operation temperature, the characteristics of the RFPA 414 change non-linearly. To compensate for the characteristics change and optimize the RFPA characteristics, the RVA 421 is controlled. The PSC 425 is responsible for detecting the RFPA characteristics change.

Hence, the PSC 425 transmits a variable attenuator control signal (VCS) to the RVA 421 in consideration of the change in the operation or environment of the RFPA 414 in order to set optimum signal attenuation. The PSC 425 also outputs a BAC Offset Signal(BOS) and a BAC Scale Factor (BSF) to the BAC 424 so that the BAC 424 can output an optimum a supply voltage control signal (SCS).

The RVA 421 receives the RF signal from the RCC 411, changes its level according to the VCS which the PSC 425 sets based on the change in the operation or environment of the RFPA 414, and provides the level-changed RF signal to the EDC 422.

The ECC 423 optimizes an envelope detection signal (EDS) received from the EDC 422 at a mean input signal level and outputs the resulting signal as an envelope compensation signal (ECS).

The BAC 424 generates the SCS and provides an optimum power supply voltage received from the ECC 423 according to the BOS and BSF received from the PSC 425. The BOS and BSF are set in based on the change in the operation or environment of the RFPA 414 in the PSC 425.

The VEC 430 includes a VUC 432 for upconverting a system power supply voltage $V_c$ and outputting an upconverted power supply voltage (USV), a transistor 431 (Q1) for changing the USV according to the SCS received from the BAP 420, and a diode 434 (D1) and an RF choke (RFC or L1) 433, for blocking the SCS from affecting $V_c$ when Q1 turns on.

A power amplification controlling method for the above bias-adaptive power amplification controlling apparatus based on shape changes in the envelope of an RF signal will be described with reference to FIGS. 4 and 5.

Referring to FIG. 4, upon receipt of an RF signal, the RCC 411 provides the RF signal to the BAP 420 and the RFD 412. The RFD 412 matches the timing of providing a bias voltage $V_p$ to the RFPA 414 with the timing of providing the output signal of the RFDA 413 to the RFPA 414 by delaying the RF signal. If the RFD 412 fails to delay the RF signal accurately, the RFDA 413 mitigates the effect of the characteristic improvement of the RFPA 414.

Figure 5:
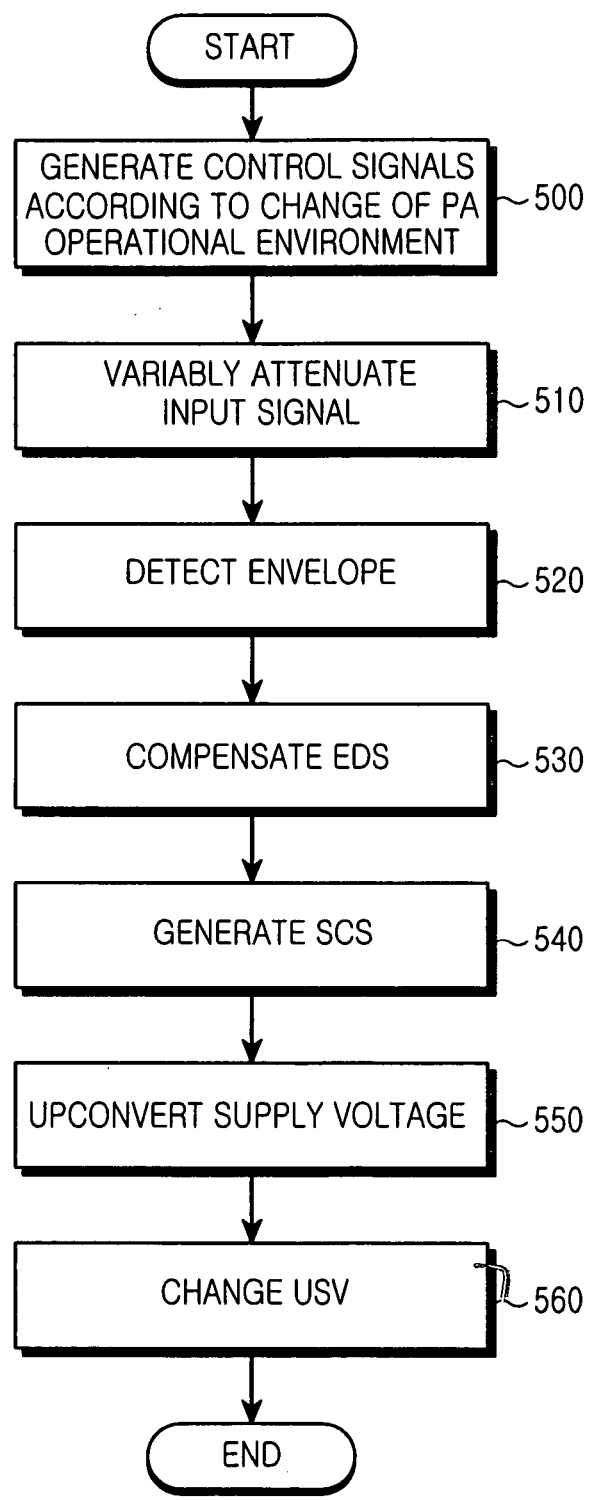
FIG. 5 is a flowchart illustrating an example of a power amplification control method in the apparatus illustrated in FIG. 5.

Referring to FIG. 5, the PSC 425 detects the change in the operation or environment of the RFPA 414 and generates control signals according to the operational or environmental change in step 500. The operational or environmental change can be a change in an input signal, temperature, a system power supply voltage, etc. If the change of the input signal causes its power to exceed a threshold, conditions under which a signal envelope is measured must be changed. However, it is difficult in practice to apply different conditions at each change. Thus, the PSC 425 generates a VCS according to the variation, to thereby control the RVA 421 to attenuate the input RF signal at or below a predetermined level. If the characteristics of the RFPA 414 change due to the change of the temperature and the system power supply voltage, it is linearity is decreased. To solve this problem, the PSC 425 generates the BSF and BOS by which the SCS is generated. That is, the PSC 425 generates the BSF to control the scale of the ECS and the BOS to control the offset of the ECS.

The RVA 421 then changes the level of the RF signal by means of the VCS in step 510. That is, the RVA 421 changes the attenuation of the RF signal according to the VCS, thereby reducing the level of the RF signal at the input of the EDC 422.

In step 520, the EDC 422 detects the envelope of the attenuated signal and transmits the resulting EDS to the ECC 423. The ECC 423 compensates the EDS and transmits the ECS to the BAC 424 such that an optimum $V_p$ can be provided to the RFPA 414 in a predetermined operation environment in step 530. In step 540, the BAC 424 generates the SCS from the ECS according to the BSF and BOS and transmits the SCS to the base of Q1.

Meanwhile, the VUC 432 in the VEC 430 upconverts the externally received system power supply voltage $V_c$ and transmits the USV to the collector of Q1 in step 550. Q1 changes the USV according to the SCS and outputs the changed USV as $V_p$ to the RFPA 414 in step 560. During this operation, the RF choke 433 and the diode 434 connected to Q1 in parallel block $V_p$ from affecting In accordance with the above-described embodiment of the present invention, the power amplification control apparatus, including the RAP, BAP and VEC, operates based on bias adaptation using shape changes in an RF signal envelope. On the other hand, the power amplification control apparatus according to another embodiment of the present invention operates based on bias adaptation using envelope shape changes in a baseband signal envelope. This power amplifying apparatus will be described briefly with reference to FIG. 6.

Figure 6:
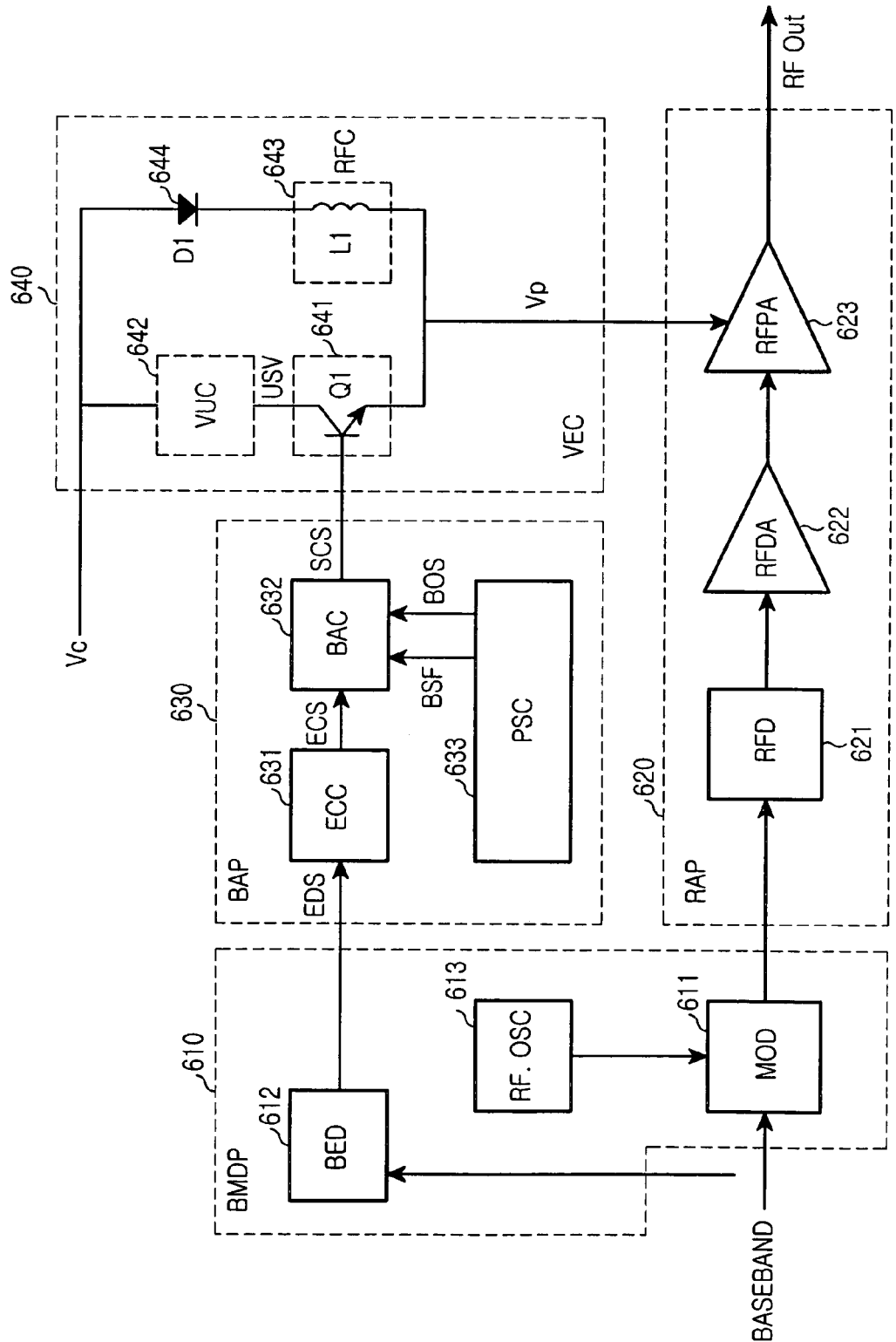
FIG. 6 is a block diagram illustrating an example of a power amplification control apparatus based on a bias control scheme according to another embodiment of the present invention.

FIG. 6 illustrates a power amplification controlling apparatus according to another embodiment of the present invention.

Referring to FIG. 6, the power amplification control apparatus operates based on bias adaptation using shape changes in the envelope of a baseband signal having a high PAR. In the power amplification control apparatus, a Baseband Modulation and envelope Detection Part (BMDP) 610 includes a modulator (MOD) 611 for modulating and upconverting a baseband signal, a baseband envelope detector (BED) 612 for detecting the envelope of the baseband signal, and a local oscillator (RF OSC) 613 for providing a local oscillation signal to the MOD 611.

Because the BMDP 610 provides the input baseband signal to both an RAP 620 and a BAP 630, the RAP 620 is configured in the same manner as the RAP 410 except for the omission of the RCC illustrated in FIG. 4. The BAP 630 is also the same in configuration as the BAP 420 except for the omission of the EDC illustrated in FIG. 4.

A power amplification controlling method for the apparatus illustrated in FIG. 6 will be described with reference to FIG. 7.

Figure 7:
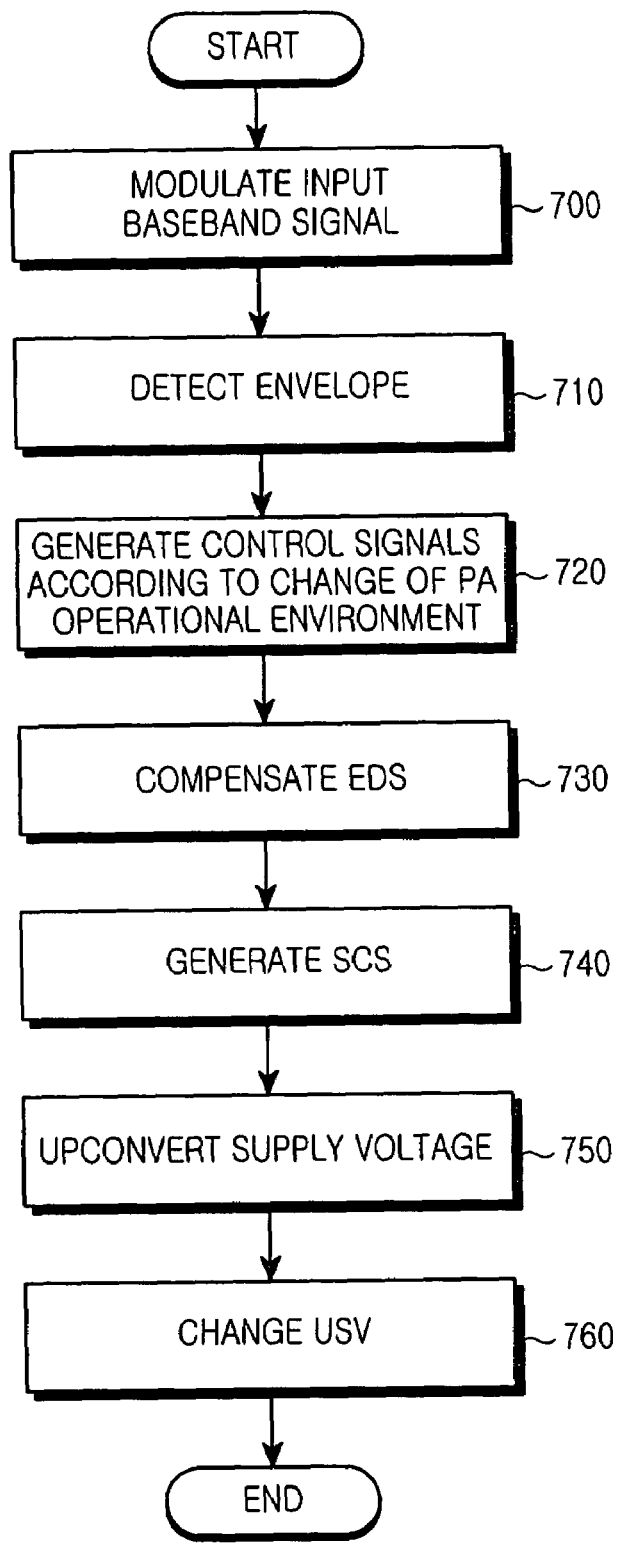
FIG. 7 is a flowchart illustrating an example of a power amplification controlling method in the apparatus illustrated in FIG. 6.

Referring to FIG. 7, when an input baseband signal is provided to both the MOD 611 and BED 612, the MOD 611 modulates and upconverts the baseband signal to an RF signal using the local oscillation signal from the local oscillator 613 in step 700. An RFD 621 delays the RF signal to match the timing of providing the bias voltage $V_p$ from a VEC 640 to an RFPA 623 with the timing of providing the output of an RFDA 622 to the RFPA 623.

The RFDA 622 amplifies the delayed RF signal and the RFPA 623 amplifies the RF signal received from the RFDA 622 by $V_p$ received from the VEC 640.

In step 710, the BED 612 detects the envelope of the baseband signal and transmits it to the BAP 630.

The BAP 630 and the VEC 640 operate in the same manner as their counterparts, that is, the BAP 420 and the VEC 430 illustrated in FIG. 4, respectively, except for the difference that a BAC 632 only controls the SCS according to a BSF and a BOS received from a PSC 633, taking account of the change in the operation or environment of the RFPA 622, while both the RVA 421 and the BAC 422 control generation of the SCS in FIG. 4. The change in the operation or environment refers to a change in an input signal, temperature, and a system power supply voltage. The operational or environmental change varies the characteristics of the RFPA 623, reducing its linearity. To improve the linearity, the PSC 633 generates the BSF and BOS by which to control the SCS in step 720. That is, the PSC 633 generates the BSF to adjust the scale of the ECS and the BOS to control the offset of the ECS.

Steps 730 through 760 are the same as steps 530 through 560 illustrated in FIG. 5. Thus, their description is not provided here.

Now, a description is made of a method of controlling a bias voltage for a PA according to the change in a power supply voltage in a third embodiment of the present invention.

Figure 8:
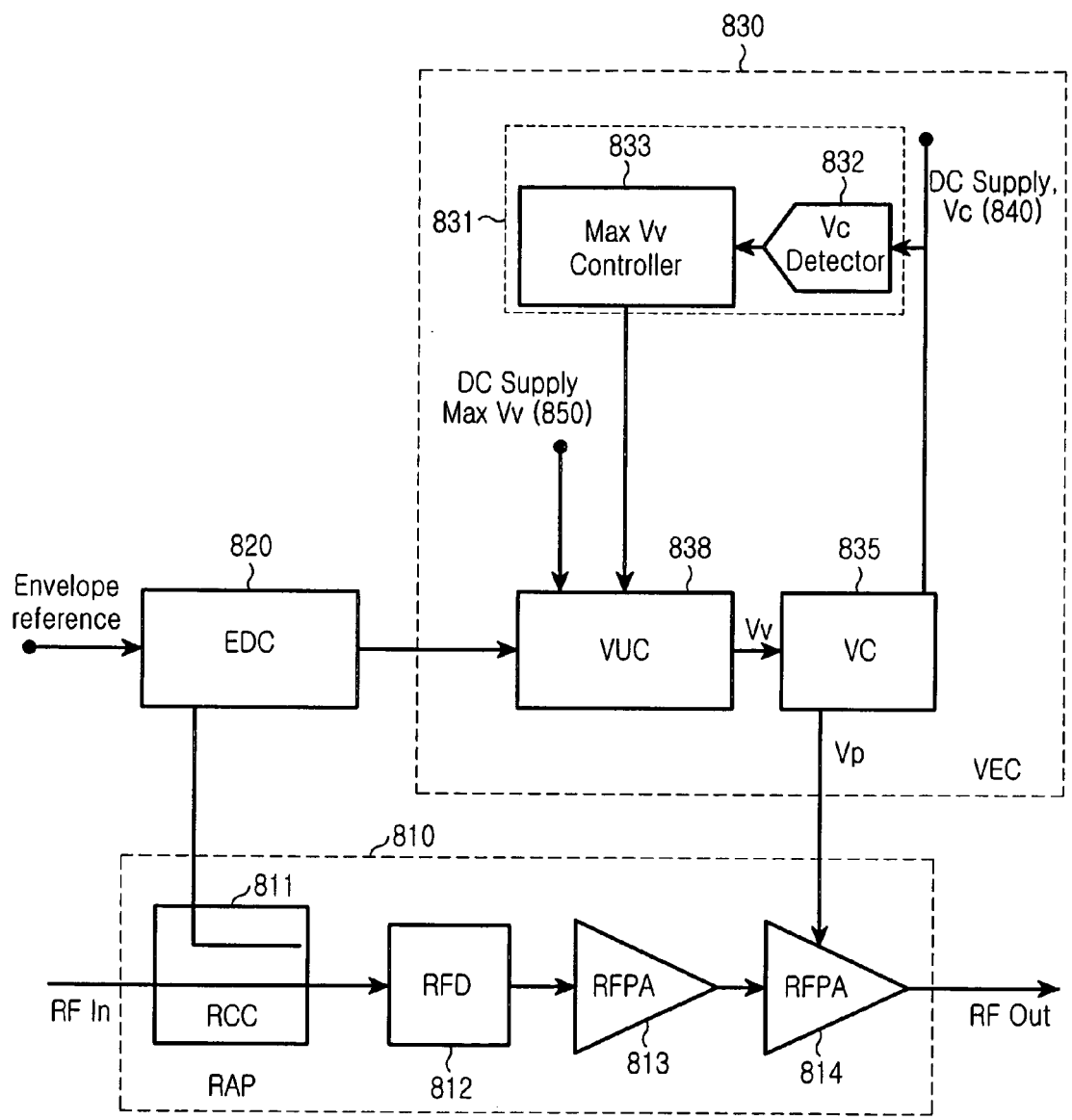
FIG. 8 is a block diagram illustrating an example of a power amplification control apparatus based on a bias control scheme according to a third embodiment of the present invention.

FIG. 8 is a block diagram illustrating an example of the structure of a power amplification control apparatus according to a third embodiment of the present invention.

Referring to FIG. 8, the power amplification controlling apparatus comprises a RAP 810 for amplifying an input RF signal, an EDC 820 for detecting the envelope of the RF signal, and a VEC 830 for providing a controlled bias voltage $V_p$ to the RAP 810.

The RAP 810 includes an RCC 811 for providing the input RF signal to both the EDC 820 and a RFD 812, and a RFPA 814.

As in the first and second embodiments of the present invention, the RAP 810 includes the RFD 812 for delaying the RF signal by a predetermined time to match the timing of signal output from the VEC 830 to the RFPA 814 with the timing of signal output from an RFDA 813 to the RFPA 814. The RCC 811, connected to the EDC 820 and the RFD 812, provides the RF signal to them. The RFDA 813 controls the level of the delayed RF signal and transmits the resulting signal to the RFPA 814.

The VEC 830 includes a VUC 838 for changing a power supply voltage Max $V_v$ received from a DC supply 850 according to the signal envelope, an ECC 831 for outputting a control signal to the VUC 838 according to the change in power supply voltage $V_c$ from a first DC supply 840, and a VC 835 for combining $V_v$ received from the VUC 838 with $V_c$ and outputting the combined voltage $V_p$ to the RAP 810.

The VUC 838 converts Max $V_v$ received from a second DC supply 850 to the variable DC voltage $V_v$ according to the signal envelope detected by the EDC 820.

The ECC 831 controls the maximum output voltage Max $V_v$ of the VUC 836 according to the change in $V_c$. The VC 835 provides the sum of $V_v$ and $V_c$ as the bias voltage $V_p$ to the RFPA 814.

The ECC 831 includes a $V_c$ detector 832 for detecting the change of $V_c$ from the first DC supply 840 and a Max $V_v$ controller 833 for controlling the maximum output voltage Max $V_v$ of the VUC 836.

Figure 9:
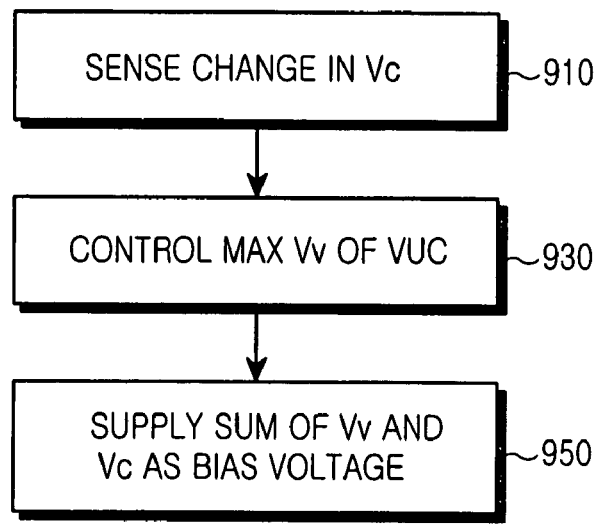
FIG. 9 is a flowchart illustrating an example of a power amplification controlling method for the apparatus illustrated in FIG. 8.

FIG. 9 is a flowchart illustrating an example of a power amplification controlling method, that is, a bias voltage controlling method for the apparatus illustrated in FIG. 8 according to the third embodiment of the present invention.

Referring to FIG. 9, the ECC 831 detects a change in $V_c$ received from the first DC supply 840 in step 910. The ECC 831 controls the maximum output voltage Max $V_v$ of the VUC 838 according to the voltage variation in step 930.

The VC 835 provides the sum of $V_v$ from the VUC 838 and $V_c$ from the first DC voltage 840 as the bias voltage $V_p$ to the RFPA 814.

Figure 10:
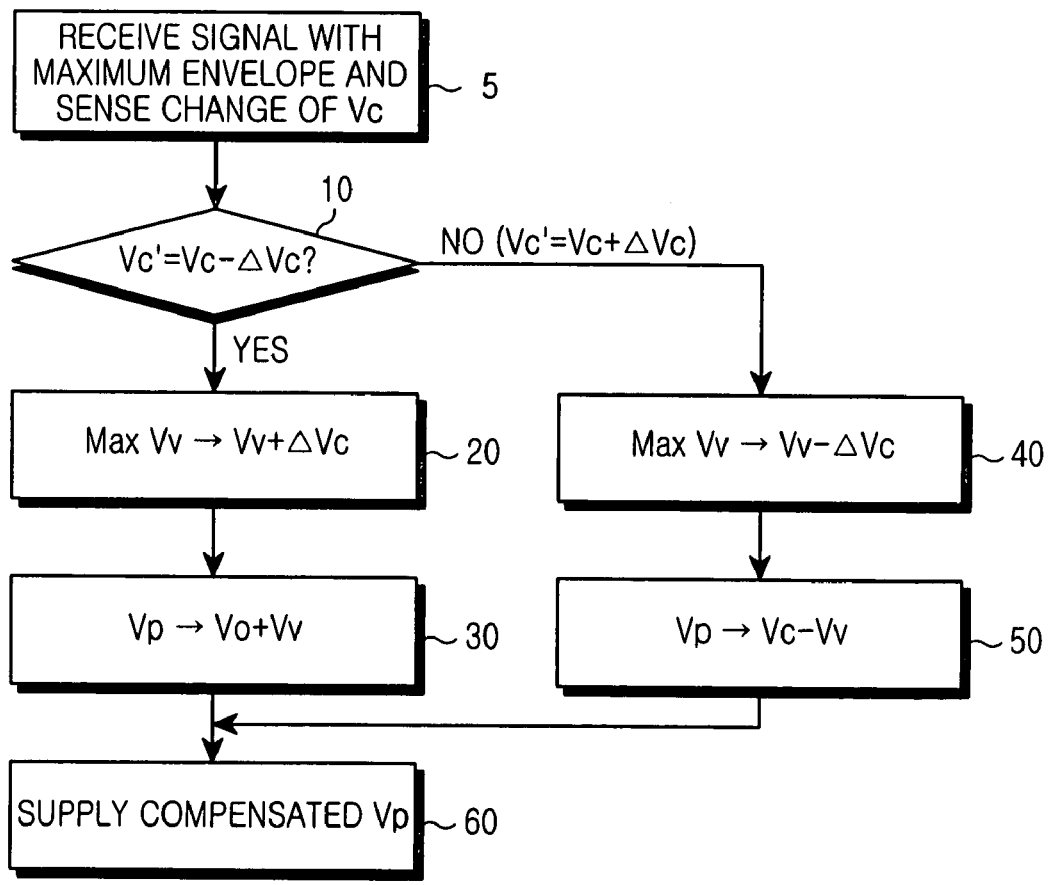
FIG. 10 is a detailed flowchart illustrating an example of the power amplification controlling method of FIG. 9.

FIG. 10 is a flowchart illustrating an example of the power amplification controlling method of FIG. 9 in more detail.

Referring to FIG. 10, if $V_c$ is changed to $V_c'$ due to electricity failure or some problem with a rectifier and a signal having a maximum envelope is received, the $V_c$ detector 832 detects the variation of $V_c$ in step 5. In step 10, the Max $V_v$ controller 833 determines whether the voltage variation is a voltage decrease $-\Delta V_c$ or a voltage increase $+\Delta V_c$. If it is a voltage decrease, the Max $V_v$ controller 833 adjusts the maximum output voltage Max $V_v$ of the VUC 838 so that Max $V_v'=V_b-V_c'=V_b-(V_c-\Delta V_c)=V_b-V_c+\Delta V_c=V_v+V_c$ in step 20. Max $V_v'$ is the adjusted maximum output voltage of the VUC 838 and $V_b$ is the break-down voltage of a transistor, that is, the voltage of a signal having a maximum envelope.

In step 30, the output voltage $V_p$ of the VC 835 is adjusted so that $V_p'=V_c'+V_v'=V_c-\Delta V_c+V_v+\Delta V_c=V_c+V_v$. The output voltage $V_p'$ of the VC 835 is provided as a bias voltage to the RFPA 614 in step 60. Therefore, the characteristics of the RFPA 814 are maintained when there is a change in the power supply voltage.

If there is a voltage increase, the Max $V_v$ controller 833 adjusts the maximum output voltage Max $V_v$ of the VUC 838 so that Max $V_v'=V_b-V_c'=V_b-(V_c+\Delta V_c)=V_b-V_c-\Delta V_c=V_v-\Delta V_c$ in step 40. In step 50, the output voltage $V_p$ of the VC 835 is adjusted so that $V_p'=V_c'+V_v'=V_c+\Delta V_c+V_v-\Delta V_c=V_c=V_v$. The output voltage $V_p'$ of the VC 835 is provided as the bias voltage to the RFPA 614 in step 60.

Therefore, the phenomenon that $V_p$ exceeds $V_b$ is prevented, thereby protecting the transistor.

Figure 11A:
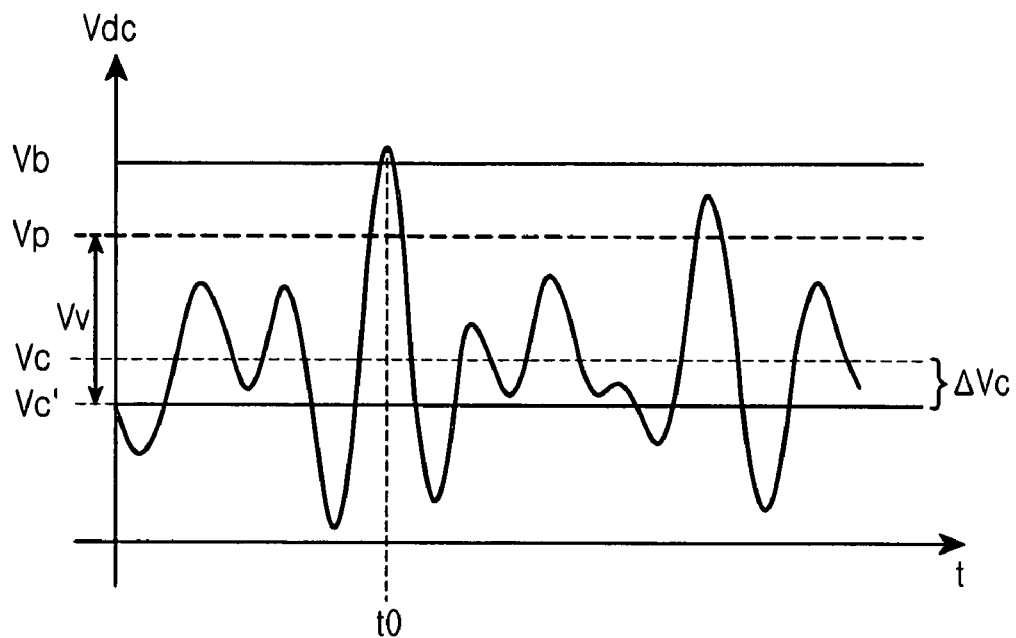
Figure 11B:
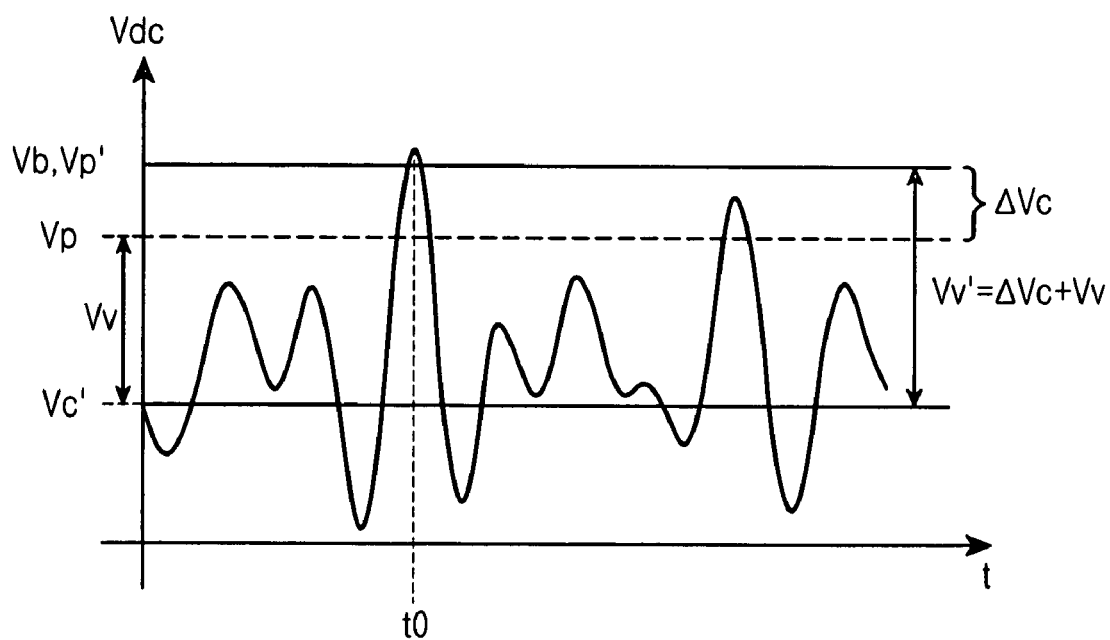

FIGS. 11A and 11B are graphs illustrating an example of the relationship among the power supply voltage $V_c$, the transistor break-down voltage $V_b$, the VUC output voltage $V_v$, and the bias voltage $V_b$ over the input signal envelope, when the power supply voltage drops.

Referring to FIGS. 10A and 11B, at time t0, $V_c$ drops to $V_c'$ with a decrement $\Delta V_c$ and an RF signal having a maximum envelope is input. The voltages will be considered with respect to time t0. Referring to FIG. 11A, $V_p = V_c - \Delta V_c + V_v < V_b$, causing clipping in the conventional power amplifying apparatus. On the contrary, the problem is overcome in the power amplifying apparatus of the embodiment of the present invention since $V_v$ is compensated so that $V_v' = V_v + \Delta V_c$ and thus $V_p$ rises so that $V_p' = V_c + V_v$, as illustrated in FIG. 11B.

Figure 12A:
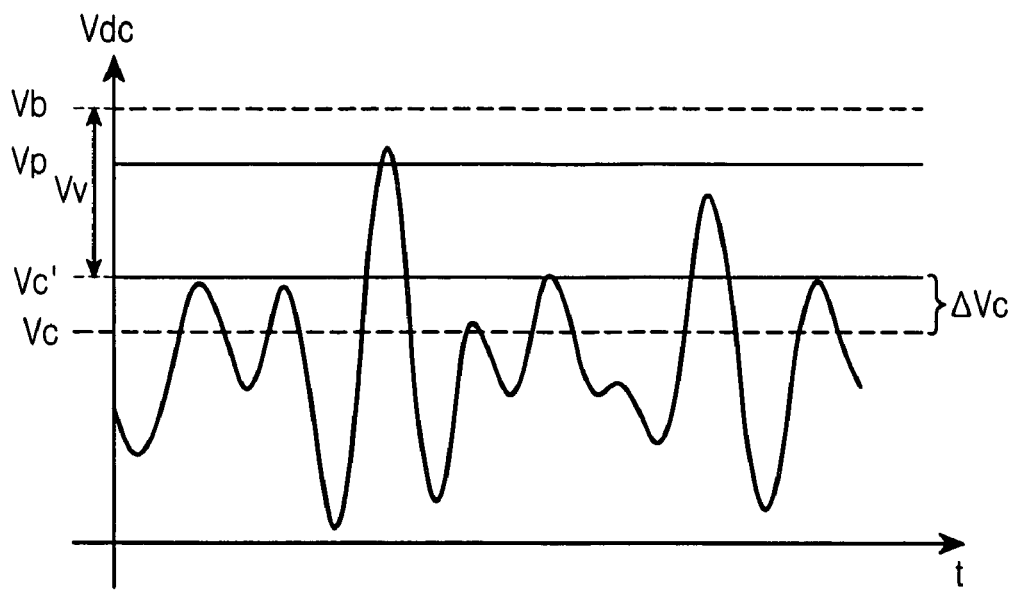
FIGS. 12A and 12B are graphs illustrating an example of a comparison in voltage relationship between the conventional power amplification control apparatus and the apparatus illustrated in FIG. 8 when the power supply voltage rises.
Figure 12B:
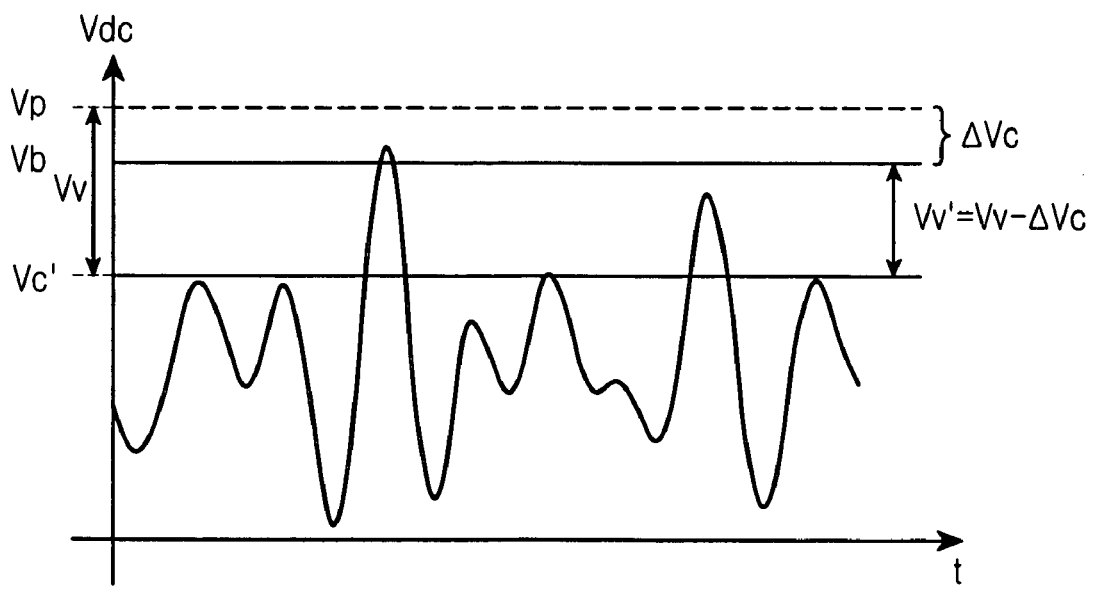

FIGS. 12A and 12B are graphs illustrating an example of the relationship among the power supply voltage $V_c$, the transistor break-down voltage $V_b$, the VUC output voltage $V_v$, and the bias voltage $V_b$ over the input signal envelope, when the power supply voltage rises.

Referring to FIGS. 12A and 12B, the voltages are considered with respect to time t0 when $V_c$ rises to $V_c'$ with an increment $\Delta V_c$ and an RF signal having a maximum envelope is input. Referring to FIG. 12A, $V_p = V_c + \Delta V_c + V_v > V_b$, deteriorating transistor characteristics or destructing a transistor in the conventional power amplifying apparatus. On the contrary, the problem is overcome in the power amplifying apparatus of the present invention since $V_v$ is compensated so that $V_v' = V_v + \Delta V_c$, and thus $V_p$ drops so that $V_p' = V_v - V_c$.

It can be further contemplated as a fourth embodiment of the present invention that the VEC 830 is substituted for the VUC 432 or 642 illustrated in FIG. 4 or FIG. 6, respectively.

As described above, the embodiments of the present invention improve the linearity of a PA by configuring the PA to be bias-adaptive according to the change in its operation or environment. Thus, amplification efficiency is increased. Also, since the characteristics of the PA are maintained when power supply voltage changes, a transistor can be protected against the voltage change.

While the invention has been shown and described with reference to certain embodiments thereof, it will be understood by those skilled in the art that various changes in form and details may be made therein without departing from the spirit and scope of the invention as defined by the appended claims.

What is claimed is:

1. A power amplification controlling apparatus based on bias adaptation, comprising:
    an amplifying part for amplifying an input radio frequency (RF) signal using a power supply voltage;
    a bias adaptation part for detecting at least one environmental change of the amplifying part, controlling an attenuation of the RF signal based on the at least one environmental change and generating a supply voltage control signal according to an envelope detection signal from the controlled RF signal; and
    a power supply part for changing the power supply voltage in response to the supply voltage control signal.

2. The power amplification controlling apparatus of claim 1, wherein the environmental change of the amplifying part occurs according to a mean input power, a system power supply voltage, or an operation temperature.

3. The power amplification controlling apparatus of claim 1, wherein the bias adaptation part comprises:
    a power amplifier supply voltage controller for detecting the at least one environmental change of the amplifying part and generating a variable attenuator control signal by which the supply voltage control signal is generated according to the at least one environmental change;
    a variable attenuator for controlling the attenuation of the RF signal according to the variable attenuator control signal;
    an envelope detector for generating the envelope detection signal by detecting the envelope of the controlled RF signal; and
    a bias adaptation circuit for generating the supply voltage control signal using the envelope detection signal.

4. The power amplification controlling apparatus of claim 3, wherein the power amplifier supply voltage controller further outputs a scale vector signal and an offset signal by which the supply voltage control signal for the power supply voltage is generated.

5. The power amplification controlling apparatus of claim 1, wherein the power supply part comprises:
    a voltage upconverter for upconverting a system power supply voltage;
    a transistor for controlling the upconverted power supply voltage according to the power supply voltage control signal, and outputting the controlled power supply voltage to the amplifying part;
    a diode connected to the system power supply voltage; and
    an RF choke connected to a cathode of the diode.

6. A power amplification controlling method based on bias adaptation, comprising the steps of:
    detecting at least one environmental change of an amplifier,
    amplifying an input radio frequency (RF) signal,
    controlling an attenuation of the RF signal based on the at least one environmental change,
    detecting an envelope of the controlled RF signal,
    generating a supply voltage control signal according to the envelope detection signal; and
    changing a power supply voltage in response to the supply voltage control signal and applying the changed power supply voltage as a bias voltage for amplification.

7. The power amplification controlling method of claim 6, wherein the at least one environmental change occurs according to a mean input power, a system power supply voltage, or an operation temperature.

8. The power amplification controlling method of claim 6, further comprising the steps of:
    detecting the at least one environmental change of the amplifier and generating a variable attenuator control signal by which the supply voltage control signal is generated according to the detected environmental change;
    controlling the RE signal according to the variable attenuator control signal;
    generating an envelope detection signal by detecting the envelope of the controlled RF signal; and
    generating the supply voltage control signal using the envelope detection signal.

9. The power amplification controlling method of claim 8, further comprising the step of generating a scale vector signal and an offset signal by which the control signal for the power supply voltage is generated.

* * * * *